US005082084A

United States Patent [19]

Ye-Ming

[11] Patent Number: 5,082,084

[45] Date of Patent: Jan. 21, 1992

[54] EXTENSIBLE SOUND CASE

[76] Inventor: Tsao Ye-Ming, Rm. No. 6-11, 6/F., No. 782, Ting Chou Rd., Taipei 107, Taiwan

[21] Appl. No.: 555,839

[22] Filed: Jul. 23, 1990

[51] Int. Cl.[5] .............................................. H05K 5/00

[52] U.S. Cl. .................................... 181/153; 181/199

[58] Field of Search ............... 181/148, 153, 150, 178, 181/199, 156, 129, 190

[56] References Cited

U.S. PATENT DOCUMENTS

| | | | |
|---|---|---|---|
| 4,058,995 | 11/1977 | Greaves | 181/178 X |
| 4,556,121 | 12/1985 | Palmaer et al. | 181/129 |
| 4,591,020 | 5/1986 | Hruby, Jr. | 181/148 X |
| 4,889,208 | 12/1989 | Sugihara | 181/148 |

*Primary Examiner*—Brian W., Brown
*Attorney, Agent, or Firm*—Asian Pacific International Patent and Trademark Office

[57] ABSTRACT

An extensible sound case, comprises a speaker and an extensible sound chest assembly. The sound chest assembly can be extended to increase the space for resonance or drawn together to minimize space occupation.

4 Claims, 4 Drawing Sheets

EXTENSIBLE SOUND CASE

BACKGROUND OF THE INVENTION

The present invention is related to sound cases and more particularly to an extensible sound case which comprises an extensible sound chest assembly for resonance so as to improve resounding quality when in use, or to minimize space occupation when not in use.

The resounding quality of a sound case is generally determined according to the quality of signal source, speaker and sound chest. It is known that a longer sound chest enhances resonance. However, a big sound case occupies considerable space and is more inconvenient to carry. If the size of a sound case is reduced, a satisfactory resonance may be difficult to achieve.

SUMMARY OF THE INVENTION

The present invention has been accomplished with the above circumstances in view. It is one object of the present invention to provide an extensible sound case which can be expanded to increase a sound space for resonance so as to improve resounding quality.

It is another object of the present invention to provide an extensible sound case which can be collapsed to minimize space occupation.

BRIEF DESCRIPTION OF THE DRAWINGS

The present invention will now be described by way of examples with reference to the annexed drawings, in which.

DETAILED DESCRIPTION OF THE PREFERRED EMBODIMENTS

Figure 1:
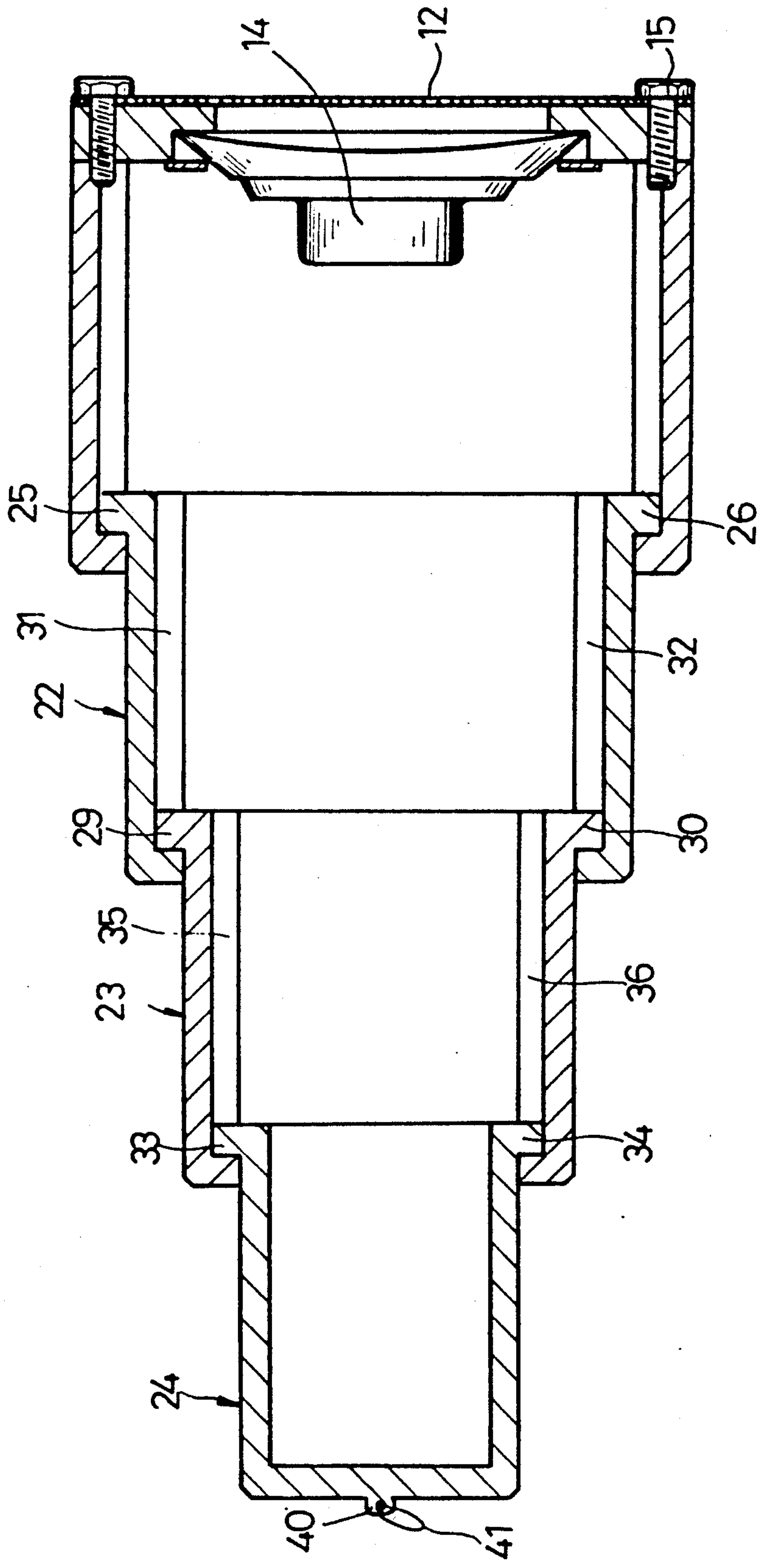
FIG. 1 is a sectional view of an extensible sound case of the present invention in extended condition.

Referring to the annexed drawings in greater detail, a sound case 10 or 11 of the present invention generally comprises a wire netting member 12 having a speaker mounting board 13 attached thereto at one side for mounting a speaker 14, and an extensible sound chest assembly 20. The sound chest assembly 20 comprises a hollow tubular main body 21 fixedly secured to the speaker mounting board 13 by screw bolts 15 and having an opening through its central axis and two opposite slide ways 27, 28 internally and symmetrically made on the inner wall surface. There is a first tubular telescopic member 22 inserted through the center opening of he main body 21 and having two symmetrical lugs 25, 26 at one end and respectively set to slide along the two slide ways 27, 28 of the main body 21. The first telescopic member 22 is designed in such a manner that its two lugs 25, 26 are protected from breaking away from the center opening of the main body 21 while it is permitted to slide in and out of the main body 21. There is a second telescopic member 23 inserted to slide in the first telescopic member 22. Similar to the first telescopic member 22, the second telescopic member 23 comprises two symmetrical lugs 29, 30 at one end and respectively set to slide along two opposite slide ways 31, 32 on the inner wall surface of the first telescopic member 22. There is still a third tubular telescopic member 24 having two symmetrical lugs 33, 34 at one end and respectively set to slide along two opposite slide ways 35, 36 on the inner wall surface of the second telescopic member 23. The third telescopic member 24 comprises a flange 40 at an opposite end with a pull ring 41 fastened thereon at the center. After the first, second and third connections 22, 23, 24 are respectively inserted in the main body 21, an extensible sound chest assembly 20 is set up.

Figure 2:
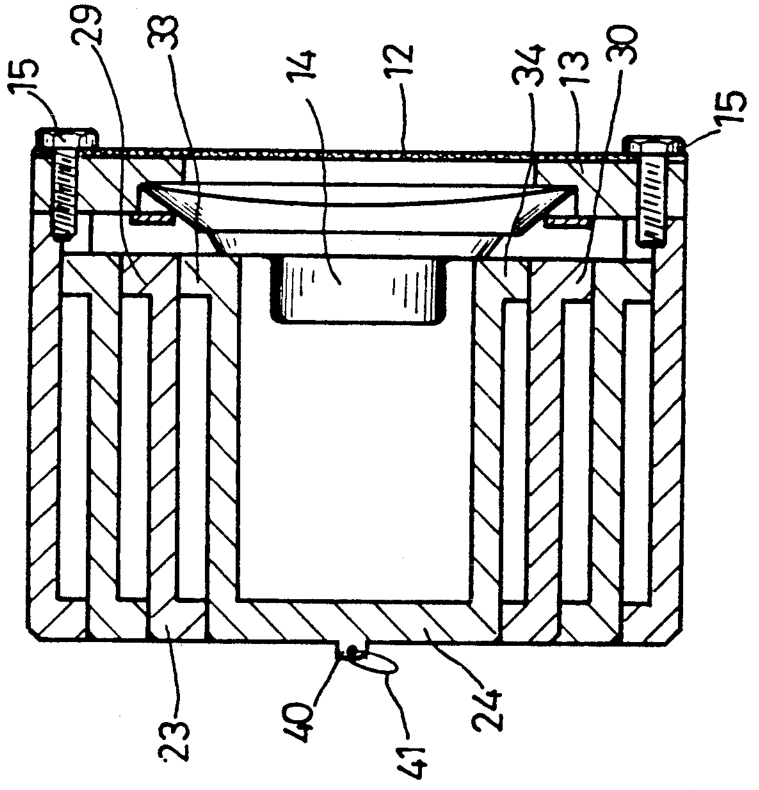
FIG. 2 is a sectional view thereof, in which the sound case is retracted.
Figure 3:
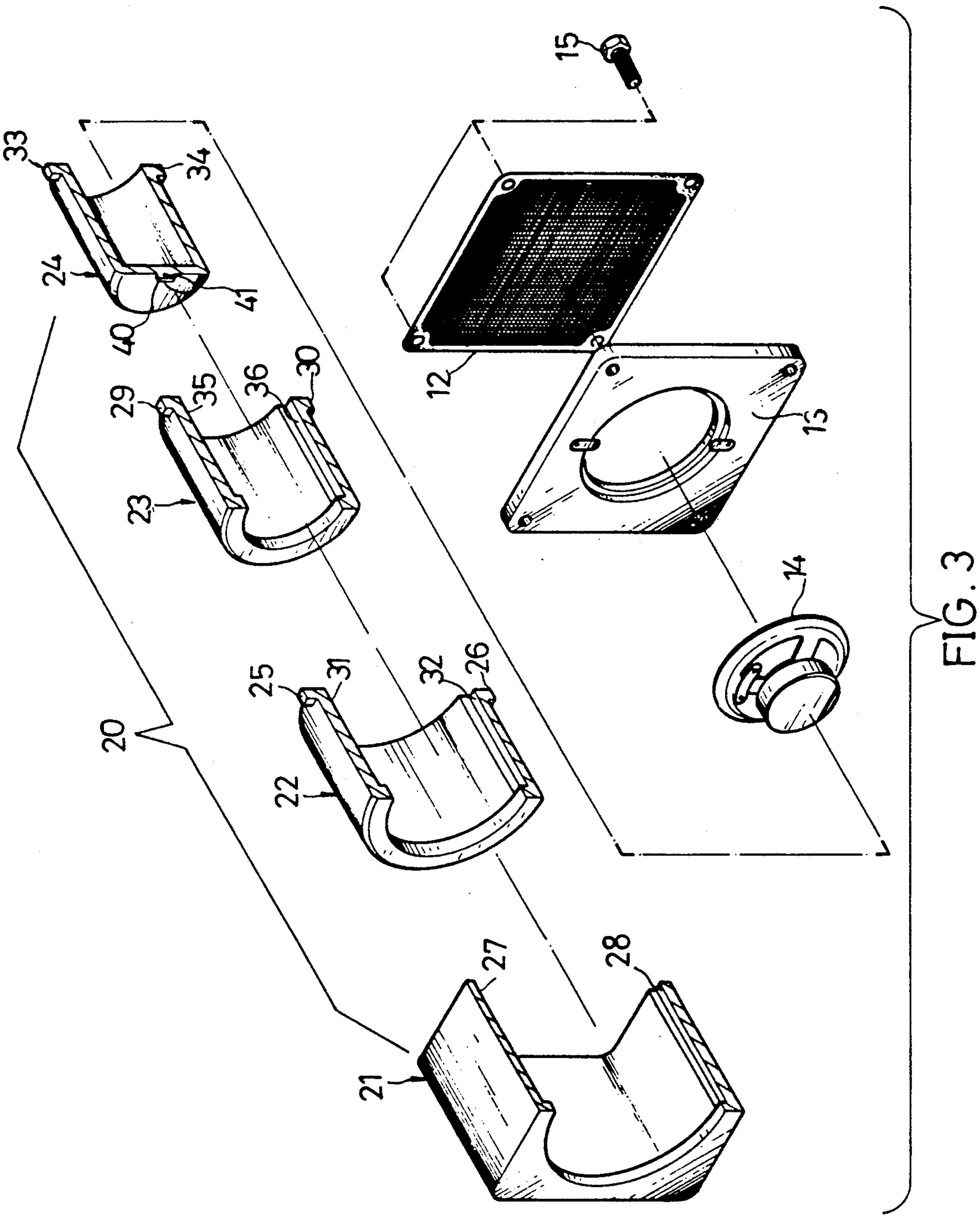
FIG. 3 is a perspective fragmentary view thereof.

In the afore-said embodiment, the sound chest assembly 20 comprises a main body and three telescopic members. In practice, the number of telescopic members can be flexibly increased or reduced according to requirements. When in use, the sound chest assembly 20 is pulled to an expanded condition through the pull ring 41 on the third telescopic member 24 thereof so as to provide a maximum space for the resonance of the sound waves from the speaker 14 (see FIG. 1). Therefore, improved resounding quality is achieved through the present invention. When not in use, the sound chest assembly 20 is drawn together (see FIG. 2) to minimize space occupied.

Figure 5:
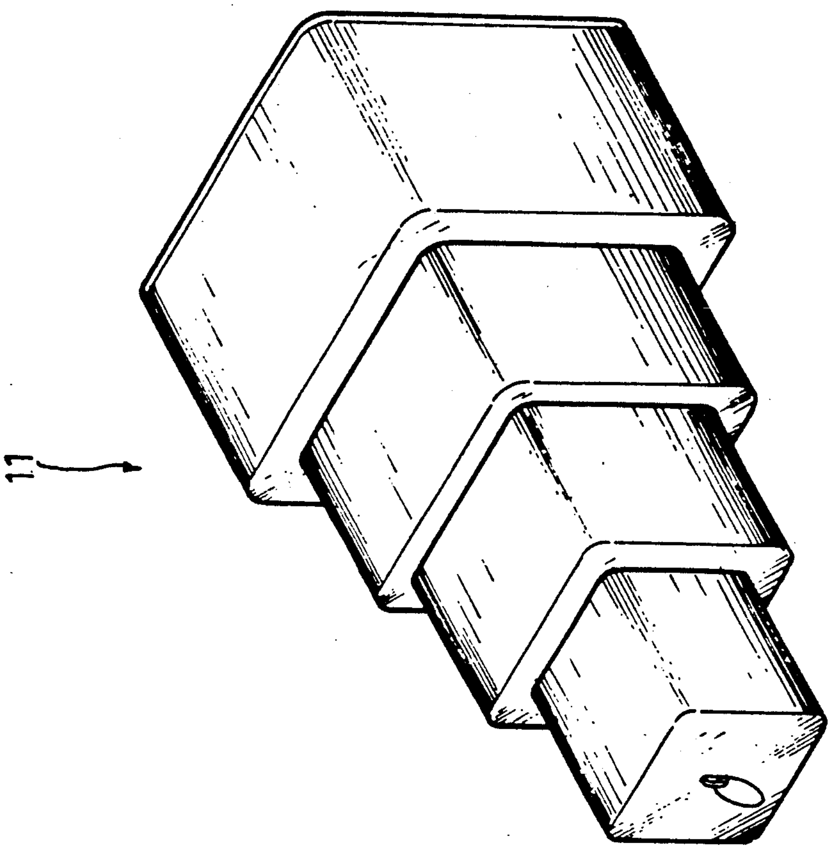
FIG. 5 illustrates an alternate form of the present invention.
Figure 4:
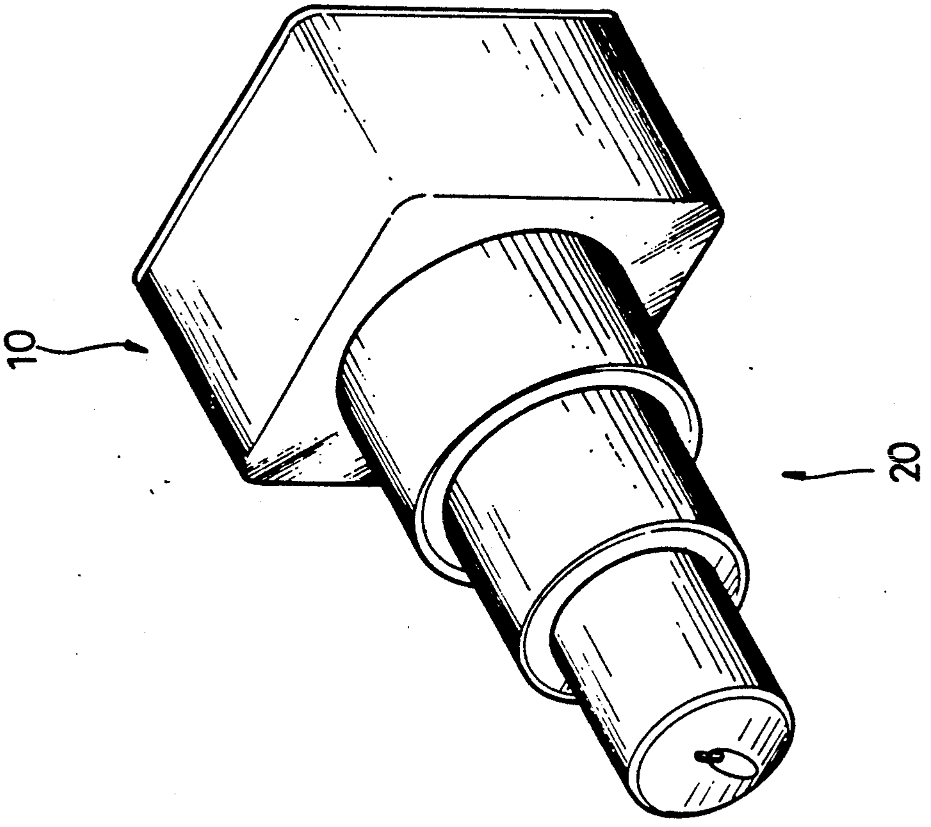
FIG. 4 is a perspective view thereof.

An extensible sound case of the present invention may be designed in different shapes. FIGS. 4 and 5 illustrate two alternate forms of extensible sound case according to the present invention.

As indicated, the present invention may be variously embodied. Recognizing that various modifications been apparent, the scope herein shall be deemed as defined in the claims set forth hereinafter.

I claim:

1. An extensible sound case comprising:

a speaker mounting board having a central hole therethrough for sound waive transmission; a speaker fixedly secured to said mounting board for broadcasting through the central hole; a porous wire netting member extending across the central hole to overlie said speaker; a hollow tubular sound chest main body fixedly secured to said mounting board in surrounding relation to said speaker; and a plural number of hollow tubular telescopic members slidably telescoped within each other and within said sound chest main body, whereby said telescopic members can have retracted positions within said main body or extended positions projecting from said main body away from the speaker mounting board; said sound chest main body and said hollow tubular telescopic members cooperatively forming a resonant sound enclosure members are in their extended positions.

2. The extensible sound case of claim 1, and further comprising a separate means for slidably guiding each telescopic member so that each telescopic member is confined to linear motion during its movement into or out of the sound chest main body; each said guiding means comprising two spaced lugs extending from an associated telescopic member, and two spaced guide grooves in the associated main body or mating telescopic member.

3. The extensible sound case of claim 2, wherein each of said spaced guide grooves is closed at one end thereof to form a stop for limiting the motion of the associated guide lug in a direction away from the speaker mounting board.

4. The extensible sound case of claim 2, wherein there are three telescopic members.

* * * * *